United States Patent [19]

O'Hare

[11] 4,441,067

[45] Apr. 3, 1984

[54] THERMAL DIELECTRIC ELECTRIC POWER GENERATOR

[76] Inventor: Louis R. O'Hare, 1700 Banyan #3, Fort Collins, Colo. 80526

[21] Appl. No.: 198,359

[22] Filed: Oct. 20, 1980

[51] Int. Cl.$^3$ .............................................. H02N 1/00
[52] U.S. Cl. .................................... 322/2 A; 310/306
[58] Field of Search ............... 322/2 R, 2 A; 310/300, 310/306, 308; 320/1; 136/205, 212, 239; 361/282

[56] References Cited

U.S. PATENT DOCUMENTS

| | | | |
|---|---|---|---|
| 2,655,431 | 4/1953 | Bichowsky | 310/306 X |
| 3,243,687 | 3/1966 | Hoh | 322/2 R |
| 4,220,906 | 9/1980 | Drummond | 322/2 A |

Primary Examiner—R. J. Hickey

[57] ABSTRACT

A convection column is used to produce a draft to draw alternately hot and then cool air over temperature variable capacitors on which a charge is placed, the capacitors being grouped in sets, and alternate sets of capacitors are each repeatedly heated and then cooled in such a way that while one set is being heated the other set is being cooled and part of the total charge that is shared by the combined sets is thereby made to cycle back and forth between the sets and to flow through a rectifier and a useful electric work load which are in series with these sets with the effect that useful electric power is extracted by means of the electric load. In one embodiment the two sets of temperature variable capacitors each have different types of temperature coefficients with respect to their respective dielectric materials, one set of capacitors having positive temperature coefficient and the other negative and both sets are heated and cooled together with part of their shared charge moving from one set to another when both are heated and said charge moving back when both are cooled to produce a moving charge and a current flow for useful work in a series connected load.

11 Claims, 6 Drawing Figures

THERMAL DIELECTRIC ELECTRIC POWER GENERATOR

This invention is a type of electric power generator which extracts energy from heat and uses changing electric capacitance to provide electric power. The capacitance changes required to produce the power are provided by capacitors whose dielectric material undergoes a dielectric constant change under the influence of a temperature change. This concept is well known in the art of power generation and a number of patents provide a variety of electric circuitry to achieve this effect with various degrees of efficiency. This present invention essentially employs the bridge rectifier circuitry of my former U.S. Pat. No. 4,151,409 called, "Direct Current Variable Capacitance Electric Generator." This is because the condition of a slow alternation of current makes the use of magnetic core transformers very inefficient, and the heating and cooling of capacitors which establishes the rate of current alternations is a relatively slow process in this invention. While the FIG. 5 of that former patent describes the requirement and the bridge rectifier solution for dealing with slow alternations, nevertheless it does not specify the present means of providing temperature alternations from an inexpensive energy source such as solar heat. Especially, the former patent does not specify how temperature alternations might be provided for the capacitors without the requirement of additional outside energy sources for powering the heat alternation means. This present invention answers that need in the art. Another difference is that former U.S. Pat. Nos. 3,971,938 and 4,071,129 as well as U.S. Pat. No. 4,087,735 use transformers as an integral part of the generating process and consequently the circuitry of those patents would require massive magnetic cores if they were to be used for current generated by something as slow as temperature alternations in a dielectric. Other inventions such as the Drummond invention U.S. Pat. No. 4,220,906 effect temperature change by means of heat conducting reeds which physically contact the capacitor transfer heat and change its temperature intermittantly. That patent also uses evaporation and condensation mechanisms to change temperature by moving heat energy. Further, that patent uses impedance connected across the plates of a single capacitor which would shunt out and discharge any charge placed on the capacitor very rapidly unless the temperature change of the capacitor were so rapid that the charge could cycle between the capacitor and the impedance. This would require extremely large impedance and extremely fast thermal cycling. My present invention obviates these requirements and is different in the means it uses to cycle temperature in the capacitors. In my invention a convection pump or a fan alternately moves heated air and then cooled air against the capacitors to be heated and cooled. In this way this present invention relates to my copending application called, "Convection Powered Bellows Engine" and my copending application called, "Hybrid Solar Engine" Ser. No. 180,819 in that these describe mechanisms for utilizing solar power for providing temperature alternations. It is believed that the present invention improves on the means of temperature alternation and makes it self sustaining in a different way.

A principal object of this present invention is to improve the art by providing a means of alternating the heating and cooling of capacitors in a rapid manner for improved power output. A special objective is to provide temperature alternations from a solar collector by using only the heat of the solar collector to achieve these temperature alternations. That is to say the goal is to provide a practical way of using the readily available hot air from a simple black box collector not only to provide the heat energy that can be converted into electricity but as well to use that heat to provide the heat alternations necessary to make that conversion. Also since the rate of current flow from a given capacitor here is in proportion to the abruptness of temperature change of the capacitor, an object is to provide a very abrupt temperature change. Finally the particular object of one embodiment is to provide a system in which it is not necessary to heat one capacitor while simultaneously cooling the other to get a push pull effect but rather to only heat at one time a dissimilar pair of temperature variable capacitors and subsequently cool at another time that dissimilar pair and to thereby greatly simplify the requirements of the mechanism for push pull generation.

These and other objects and embodiments will become clear by referring to the following drawings.

FIG. 1 of the drawings is a diagram of two fluid conduits which contain tempervariable capacitors which are connected to external circuitry for electric generation.

FIG. 2 of the drawings shows a dissimilar pair of capacitors to be heated and cooled together for electric generation.

FIG. 3 of the drawings is a diagram of two conduits with capacitors showing how one is heated while the other is cooled by the action of a convection column and a solar collector with valving and linkage.

Figure 1:
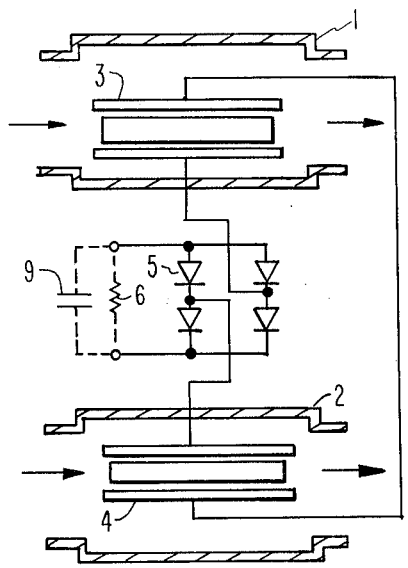

Referring then to FIG. 1 of the drawings, fluid conduits 1 and 2 each contain an array of temperature variable capacitors indicated by the capacitor symbols 3 and 4. These arrays of capacitors are alternately heated and then cooled repeatedly in such a manner that when the array symbolized by capacitor symbol 3 is heated by a heated fluid flowing in 1 then the capacitor array 4 is cooled by a cool fluid such as cool air flowing in 2. Alternatively, in the second part of the two part recurring sequence, the capacitor array symbolized by symbol 3 is cooled by a cool fluid flowing through 1 at the same time that capacitor array 4 is heated by hot fluid flowing through 2. During that part of the sequence when 3 is being heated and 4 is being cooled, an electric charge placed on 3 and 4 and shared by 3 and 4 is caused to move in part from 4 to 3 as the voltage increases on 4. This voltage increase is due to the capacitance derease of 4. In this embodiment the capacitors have a positive temperature coefficient with respect to the dielectric constant of their dielectric material and accordingly their capacitance increases as their temperature increases and visa versa. Since the same dielectric material may have a positive temperature coefficient in one temperature range and a negative temperature coefficient in another temperature range, it is necessary to specify that in this embodiment both arrays have a positive temperature coefficient in the temperature range through which they are being cycled. Forinstance, the dielectrics of the capacitors used in one embodiment are ferroelectrics such as for example barium titanate and they are cycled through the temperature range just below the Curie point from about 95 to 120 degrees C. In this embodiment as array 4 is being cooled and its capacitance is decreasing, similar capacitors in 3 are being heated through the same temperature range and their voltage is decreasing as their capacitance increases. Since the charge is isolated because the source of the charge is removed after a charge has been placed on them and because there is never a shunt across the capacitors, then the charge which was shared by 3 and 4 is caused to be shared unequally by 3 and 4. That is to say 3 and 4 will not keep their original portions of the total charge they shared because as 3 gains in capacitance and its voltage is lowering then its larger capacitance will receive a larger share of the total charge being shared. The voltage elevating on 4 will move a portion of the charge to 3. This moving charge is a current and it is caused to move through bridge rectifier 5 and electric load 6 on its way to 3. In moving through 6 it provides electric power. It should be noticed that the electric load is not a shunt across the capacitors and that no matter how much energy is caused to flow through 6, it cannot short out the charge placed on the capacitors. During the second half of the cycle when 3 is being cooled and 4 heated by means to be shown in the following figures the capacitance of 3 is decreasing and its voltage is elevating to move a portion of the charge back through 5 and 6 to 4. It is not necessary to use only temperature variable capacitors with a positive temperature coefficient, but in another embodiment both capacitor arrays are those with negative temperature coefficients and the charge moves from the heated array to the cooled array while the capacitor arrays are being cycled through temperature ranges in which their temperature coefficients remain negative. For instance, when a dielectric compound of barium titanate and ten percent approximately of strontium titanate is used in 3 and 4 for the dielectric material in the capacitors, their Curie point will be about 100 degrees C. Consequently, as these capacitors are heated from that temperature to about 120 degrees C. their capacitance will decrease. It will increase as they are cooled through that range. When two arrays of these capacitors are used in 3 and 4 and heated and cooled oppositely to each other, then a charge shared by the two will cycle between them. Again in FIG. 1 the electric load 6 is shown being connected with dotted lines to represent that there is a wide option of electric loads that may be placed there and they need not be only resistive loads but inverters converting the high voltage D.C. to lower voltage may be placed in the position of this load symbol. One such suitable inverter is a saturable core oscillator of the type widely used in the art for voltage conversion. The types are all well understood in the art to be electric loads. Finally, a fixed capacitor 9 may be placed across the load to smooth irregularities in the intermittant D.C. current, as is standard practice.

Figure 2:
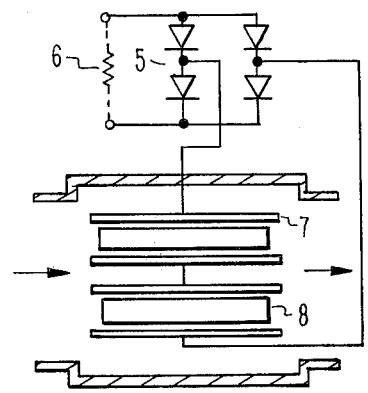

Referring then to FIG. 2, temperature variable capacitors 7 and 8 are heated and cooled simultaneously rather than the one being heated while the other is cooled as in FIG. 1. This is possible in FIG. 2 because 7 has a positive temperature coefficient and 8 a negative temperature coefficient in their dielectric material in the temperature range through which they are being cycled. For instance in a particular embodiment, 7 is of barium titanate and 8 of barium titanate with about 10 percent strontium titanate compounded into it and both capacitors are cycled together through the temperature range of about 100 to 120 degrees C. The bridge rectifier 5 is the same as in FIG. 1. The load 6 is the same as 6 in FIG. 1. In this FIG. 2 as the temperature elevates and the capacitance of 7 increases, so the increasing temperature causes the capacitance of 8 to decrease and its voltage to rise thereby moving some of the total shared charge to 7. The capacitances of 7 and 8 each change in opposite directions as they are cooled in the the subsequent part of the temperature alternation. The charge thereby cycles back and forth between 7 and 8 through 5 and 6 to provide electric power in 6.

Figure 3:
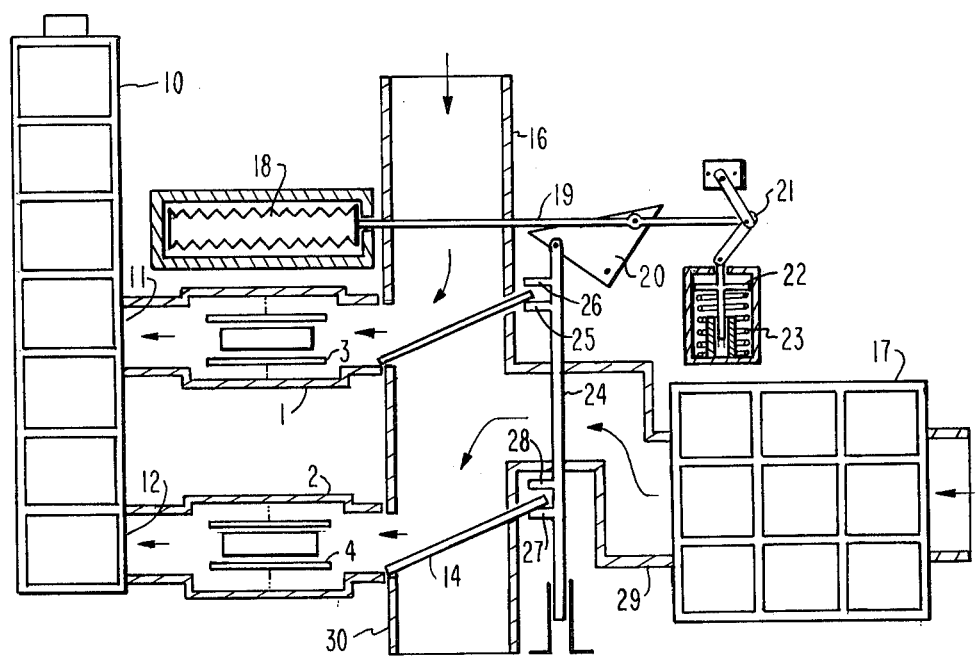

Referring then to FIG. 3, the elongated, rectangular black box solar collector 10 is positioned with its length extending vertically and with the outlet for the air that its heats being on the top so that the air within will rise and exit from the top to provide a solar powered convection column. This convection column 10 has two inlet ports 11 and 12 through which the draft from the column simultaneously draws air from conduits 1 and 2 which are the same as 1 and 2 of FIG. 1. In this FIG. 3 valve 13 is positioned to admit cool air through cool air inlet port 16 to conduit 1. Likewise valve 14 is positioned to admit hot air from collector 17 to conduit 2. The cool air moving through 1 cools capacitor array 3 just as hot air moving through 2 heats capacitor array 4. These capacitor arrays 3 and 4 are shown here by the same symbols used in FIG. 1 but their respective electric connections are omitted here to simplify the diagram and show only the essentials of heat flow, as the electric relationships are explained in FIGS. 1 and 2. In this FIG. 3 then, the temperature sensitive bellows 18 is shown in its extended position to show that it has been heated by air flowing from solar collector 17. In the extended condition 18 moves linkage arm 19 far to the right. The movement of 19 to the right rotates bell crank 20 clockwise. However, it is only in the last small increment of its extension that bellows 18 effects the movement of valve 13 and moves it to the position shown to admit cool air to 1 and to direct hot air to 2. This is because linkage arm 19 moves the over center linkage 21 as it is extending. The movement of the overcenter linkage causes piston 22 to move downwards to compress spring 23. At the temperature of maximum heat desired for capacitor 3 the temperature sensitive bellows 18 has expanded to move 21 just beyond its center position. This is because of the calibrated balance of forces between the bellows pressure and the adjusted spring tension. Once beyond its center position, 23 assists 18 in suddenly moving 19 fully to the right. As 20 then rotates clockwise as far as it can go, it moves cogged slider 24 upwards to that its cog 25 engages valve 13 to move it to the position shown where it will remain for the cooling cycle of bellows 18 and capacitor array 1. In this way the cooling cycle is begun very abruptly to enhance the rate of cooling and therefore the rate of current flow. The heating cycle of 4 is thereby also begun abruptly for the same reason. Only at the end of this cooling cycle for 2 and when 19 has moved 21 to the left overcenter position, will the overcenter linkage suddenly move fully to the left to cause bell crank 20 to rotate counterclockwise moving cog 26 downwards to reposition valve 13 to its alternate position thereby closing off cooling air to 1 and directing hot air to 1. It is clear that as cogged slider 24 is moved upward at the end of a heating cycle for 3 and 25 engages 13 to move it to admit cooling air to 3 then also cog 27 on slider 24 engages valve 14 to admit hot air to heat 4 while 3 is cooling. Inlet duct 30 is like 16. It admits cool air to 2 at the proper time. Cog 28 moves valve 14 to close off hot air from duct 29 to conduit 4 when 26 moves 13 to admit hot air to 1.

Figure 4:
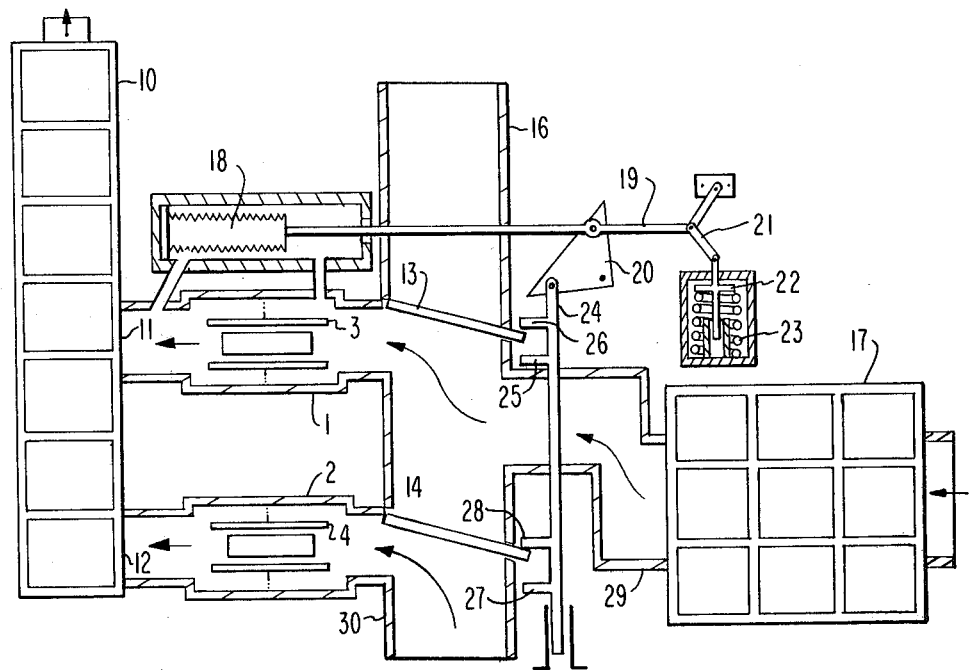
FIG. 4 shows the same components as FIG. 3 but with alternate valve positioning.

Referring then to FIG. 4, all of the elements are the same as those of FIG. 3. The elements are shown in their alternate positioning during the second half of the temperature alternating cycle at the end of a cooling period for capacitor array 3 and at the end of a heating period for 4. Bellows 18 has contracted to the extent of moving overcenter linkage 21 just beyond its center position to the left. Spring 23 moves 19 fully to the left rotating 20 counterclockwise and moving 24 downward causing 26 to contact 13 which closes off cooling air from inlet 16 and opens hot air duct 29 from collector 17 to flow hot air to conduit 1, and at the same time cog 28 on cogged slider 24 engages valve 14 to open cool air inlet 30 to cool array 4 while 3 is being heated. The convection collector 10 still produces the draft that powers the air flow of both hot and cool air. In one embodiment electric fans (not shown) are inserted in ports 11 and 12 and are used to assist convection flow and in another embodiment fans (not shown) in ports 11 and 12 replace the convection column 10.

Figure 5:
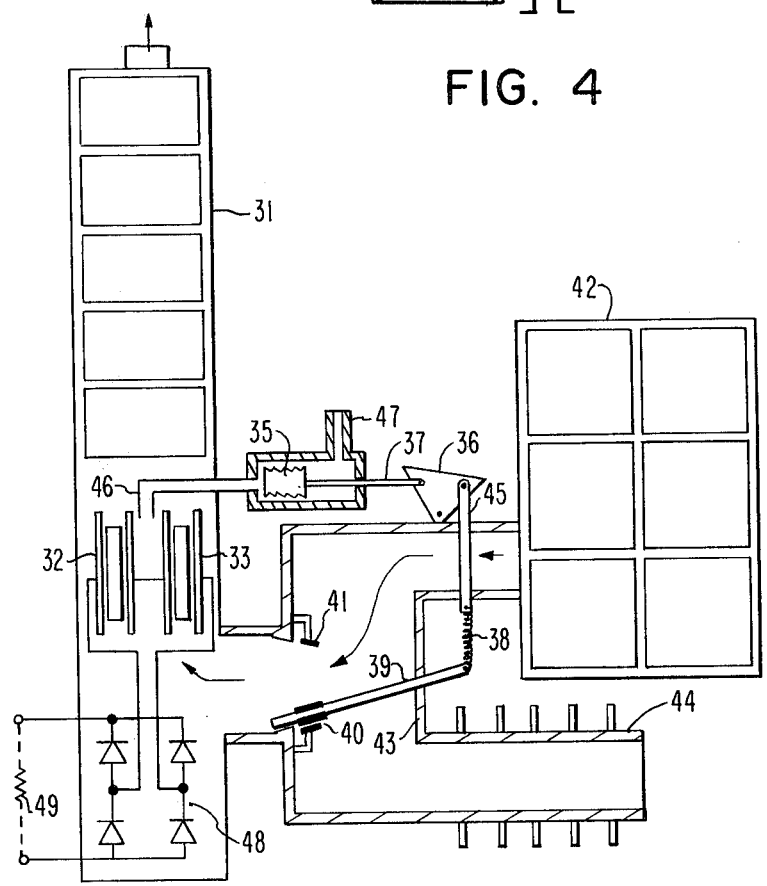
FIG. 5 shows a simplification of the temperature alternating mechanism possible when dissimilar types of temperature variable capacitors are employed.

Referring now to FIG. 5, solar heated convection column 31 draws air across both temperature variable capacitors 32 and 33. Capacitor 32 is one with a positive temperature coefficient and 33 has a negative temperature coefficient. As 32 is being heated its capacitance is increasing and its voltage is lowering and 33 at the same time is decreasing in capacitance as its temperature is being elevated, a temperature is reached at which this effect is significantly diminished. At this temperature heat sensitive bellows 35 has reached a point in its expansion at which it has rotated bell crank 36 clockwise by means of linkage arm 37 and has compressed spring 38 to the extent that the leverage force on valve 39 is sufficient to break lose the magnetic latch 40 that holds the valve in the position shown. With the holding tension of 40 now released, 35 and 38 both expand farther and swing 39 to its alternate position where it is latched by magnetic latch 41. Thereby 39 closes off the hot air being drafted from solar collector 42 to capacitors 32 and 33. This valve movement also opens duct 43 causing the draft from 31 to draw cool air from cooler 44 across 32 and 33 in which the capacitance changes reverse in each, decreasing capacitance in 32 and increasing it in 33. Linkage arm 45 converts the clockwise rotation of 36 to the linear motion that compresses 38. Duct 46 subsequently brings cooling air to 35 and when the air leaving 32 and 33 is cool enough to contract 35 sufficiently, then 37 will rotate 36 counterclockwise so far that spring 38 is placed in sufficient stress that the tension on magnetic latch 41 will open it. Once valve 39 is unlatched from 41, then 39 breaks free moving in a downward direction and it is assisted in its movement by the contraction of 38 and 35 until it engages 40. Then it is latched on magnetic latch 40 where it remains while the bellows 35 expands again. The small chimney 47 allows air of different temperatures to flow over the bellows 20. The rectifier bridge 48 causes the charge moving between 32 and 33 to move in one direction through electric load 49.

Figure 6:
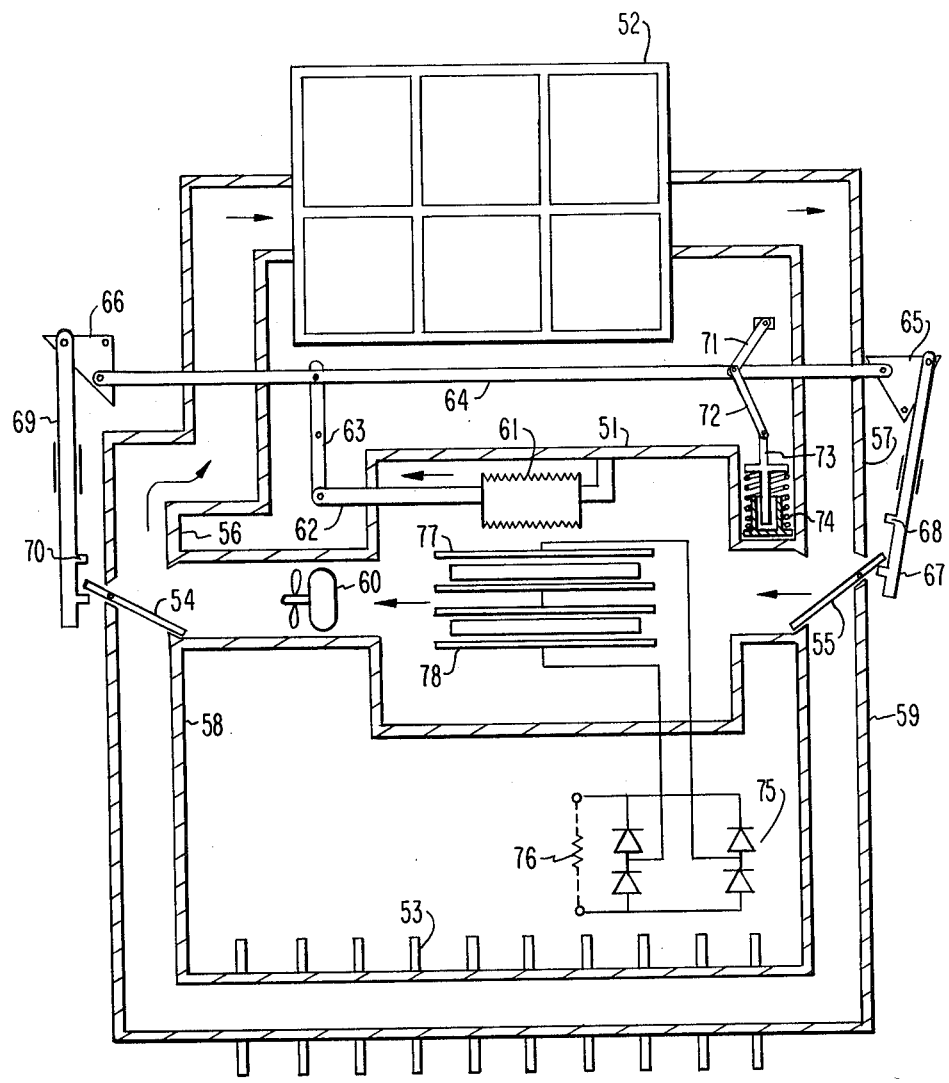
FIG. 6 is a diagram of a closed cycle temperature alternating device for conserving heat and using dissimilar temperature variable capacitors to generate electricity.

Referring then to FIG. 6, reaction chamber 51 receives either a heated fluid from black box solar collector 52 or cooled fluid from cooler 53 which is a heat exchanger placed in a cool place such as in the earth. The present indicated positioning of valves 54 and 55 shows one of two possible positions for each of these valves. In this position 51 is being heated. In the alternate position heat ducts 56 and 57 are closed by 54 and 55 respectively and cooling ducts 58 and 59 are open. Fan 60 circulates either hot or cool air or other fluid through 51. When hot fluid is circulating through 51 heat sensitive bellows 61 expands moving rod 62 to the left thereby pivoting lever 63 to move linkage rod 64 to the right. This action rotates bell crank 65 clockwise moving cogged slider 67 downwards. The upper cog 68 engages 55 near the end of the downward movement of 67. Similarly, during this time 64 is being moved to the right bell crank 66 is being rotated counterclockwise moving cogged slider 69 downwards for upper cog 70 to contact 54 just as 68 contacts 55. Thereby 54 and 55 are moved to their alternate positions to close off hot air at the end of the heating cycle. The contraction of 61 during this cooling period is caused by the action of 60 moving cool fluid such as air over 61. The contraction moves 62 to the right and 64 to the left rotating 66 clockwise and 65 counterclockwise, elevating 67 and 69 causing 54 and 55 to open 56 and 57 again to hot airflow. In this way temperature alternations are repeatedly produced in 51. The temperature changes are abrupt because of the action of the overcenter linkage 71 and 72 and spring loaded piston 73. The action of the over center linkage has been explained in FIG.3. In this FIG.6 arm 64 corresponds to 19 of FIG.3. In FIG.6 link 72 and piston 73 correspond to 21 and 22 respectively of FIG.3. Spring 74 is the same as 23. Bellows 61 functions as bellows 18 in FIG.3. The temperature variable capacitors 77 and 78 of FIG.6 correspond to 7 and 8 of FIG.2. The bridge rectifier 5 functions the same in FIGS. 1 and 2 as rectifier 75 does in FIG.6. The same applies to load 76 of FIG.6. It corresponds to the load 6 of FIGS. 1 and 2.

The heat sources in these figures are shown as solar collectors but in place of these other types of collectors such as heat exchangers are used in other embodiments of the basic inventive principle. Heat exchangers are placed in geothermal heat sources and heat exchangers replacing the solar collectors are placed in industrially heated effluence. The invention enables temperature alternations and electricity to be generated from these heat sources. Also it is not intended to limit the electric generating system to the use of the few ferroelectric dielectrics that are mentioned as examples. Nor are the temperature ranges used as examples to be understood as the only suitable temperature ranges through which ferroelectrics might be cycled for electric power generation. The temperature sensitive bellows 18 of FIG. 3 as well as bellows 61 of FIG.6 may be replaced by large temperature sensitive reeds of dissimilar metals which are larger versions of the metalic reeds used in thermostats. The reeds are so placed in the position occupied by the bellows that they open outward in the direction the bellows expands when heated during the same periods the reeds are heated.

I claim:

1. An electric power generator comprising:
    capacitive charge cycling means in the form of two sets of temperature variable capacitors, a bridge rectifier and an electric load, said bridge rectifier comprising an array of four rectifier elements connected in a series and forming a closed loop in such a manner that two of the rectifier elements have cathodes connected together and the other two elements have anodes at a common connection point, the remaining two junctions of the four rectifier elements being formed by connections between an anode and a cathode, and said capacitor sets and the bridge rectifier being serially connected in such a way that each of the two rectifier element junctions connecting the cathode of one rectifier element with the anode of another is connected to a different capacitor set and each capacitor set is connected to the other, the electric load being connected across the rectifier junction connecting the cathodes of the two rectifier elements and the rectifier junction connecting the anodes of the other two rectifier elements, said capacitive charge cycling means thereby being capable of receiving and of having shared on the sets of capacitors an electric charge which can be placed on them and of having a portion of the charge move back and forth from one capacitor set to the other through the bridge rectifier and the load as the capacitance of the capacitors is made to change repeatedly by temperature variations of the capacitors, and a fluid heating means in the form of a heat exchanger capable of contacting fluid to be heated with a thermal energy source, and a fluid cooling means providing a source of cooling fluid and being in the form of ducting with cooling fins and located in a cool place, and a temperature alternation means in the form of a fluid impeller having valving and ducting, said impeller being capable of moving a column of fluid, and said valving and ducting being capable of providing alternating fluid flow communication first between the capacitors of the capacitive charge cycling means and the fluid heating means and then in an alternate time period between capacitors of the capacitive charge cycling means and the fluid cooling means to thereby alternately heat and then cool the capacitors by means of thermal contact with the capacitors by the heated fluid and then by the cooled fluid flowing respectively from the fluid heater and then from the fluid cooler to the capacitors.

2. An electric power generator as in claim 1 in which the valving of the temperature alternation means is in the form of bellows operated valves with a temperature sensitive bellows and bellows linkage, said valves being capable of being moved by the linkage which is attached to the temperature sensitive bellows, said bellows being capable of expansions and contractions by being alternately in heat flow communication with both the heating fluid and then the cooling fluid which contact the temperature variable capacitors, said bellows being thereby also capable of alternating the valve conditions, one valve condition corresponding to a heated bellows condition and the other corresponding to a cooled bellows condition, with the valve condition in the heated bellows position providing fluid flow to the fluid cooling means to cool the bellows, and with the valve condition in the cooled bellows position providing fluid flow to the fluid heating means, and as in claim 1 having additionally an abrupt valve condition changing means in the form of cogs on the bellows linkage and overcenter linkage arms with springs capable of interacting with the bellows linkage to provide abrupt increments of motion for changing the valving condition at appropriate points in the expansion and contraction of the bellows which correspond to appropriate changeover temperatures from heating to cooling and from cooling to heating of the capacitors, the cogs on the bellows linkage being capable of moving with the linkage throughout the length of linkage travel and of contacting the valves for condition changeover in the final increments of linkage travel in either direction to thereby produce a valving change in the nearly fully expanded bellows position as well as in the nearly fully contracted bellows position, the overcenter linkage being capable of providing a sudden acceleration to the movement of the linkage in either direction of travel and of thereby providing abrupt valve condition change by means of the compression and sudden expansion of overcenter linkage springs which are attached to points above and below the bellows linkage and are held in tension against the overcenter linkage arms which are fixed to the bellows linkage in such a manner that linear movement of the bellows linkage beginning from either limit of its travel and moving toward the opposite limit is capable of causing the overcenter arms first to compress the springs and then to allow the springs to expand.

3. An electric power generator as in claim 1 in which the valving of the temperature alternation means is in the form of two valves each having two inlets and a single outlet, the valves being connected together by ducting in such a manner that each valve has one of its inlets in parallel fluid flow with one inlet of the other and the fluid heating means and each valve has the other of its inlets in parallel with the other inlet of the other valve and the fluid cooling means, said valves being disposed with respect to valve condition control that, as one, first valve is providing fluid flow from the inlet from the heating means to its exit and one first set of capacitors, the second valve is providing fluid flow from the cooling means to its exit and the second set of capacitors, and then in an alternate time period, as the second valve is providing fluid flow from the heating means to the second set of capacitors, the first valve is providing fluid flow from the cooling means to the exit of the valve and the first set of capacitors, said valving being thereby capable of providing firstly a fluid flow communication between one set of temperature variable capacitors and the heating means while at the same time providing fluid flow communication between a second set of temperature variable capacitors and the fluid flow cooling means and then in a second period providing fluid flow communication between the second set of temperature variable capacitors and the heating means while at the same time providing fluid flow communication between the first set of capacitors and the fluid cooling means, and as in claim 1 in which the two sets of temperature variable capacitors of the capacitive charge cycling means are both of the same thermal coefficient of dielectric constant and undergo dielectric constant change in the same direction through the same degrees of temperature change with the effect that, as one set is being heated by heated fluid from the fluid heating means and is thereby undergoing a dielectric constant change in one direction, the other set is being cooled by cooled fluid from the fluid cooling means and thereby undergoing a dielectric constant change in the opposite direction.

4. An electric power generator as in claim 1 in which the two sets of capacitors of the capacitive charge cycling means have different thermal coefficients of dielectric constant through the temperature range through which the temperatures on the sets of capacitors are made to change, one set having a positive thermal coefficient of dielectric constant and the other a negative thermal coefficient of dielectric constant, and as in claim 1 in which the valving of the temperature alternation means is capable of providing alternating fluid flow communication which in one period is between both sets of capacitors of the capacitive charge cycling means and the heat exchanger of the fluid heating means and in another period is between both sets of capacitors and the fluid cooling means, said valving being in the form of a single valve providing either one of two available conditions and having two inlets and a single outlet and being capable in one condition of receiving heated fluid through one inlet and exiting it through the outlet and in the other condition being capable of receiving cool fluid through the other inlet and exiting it through the outlet.

5. An electric power generator as in claim 1 in which the valving of the temperature alternation means is in the form of bellows operated valves with a temperature sensitive bellows and bellows linkage, said valves being capable of being moved by the linkage which is attached to the temperature sensitive bellows, said bellows being capable of expansions and contractions by being alternately in heat flow communication with first the heating fluid and then the cooling fluid which contact the temperature variable capacitors, said bellows thereby being also capable of alternating the valve conditions, one valve condition corresponding to a heated bellows condition and the other corresponding to a cooled bellows condition, with the valve condition in the heated bellows position providing fluid flow communication between the bellows and the fluid cooling means to cool the bellows, and with the valve condition in the cooled bellows position providing fluid flow communication between the bellows and the fluid heating means, and as in claim 1 having additionally an abrupt valve condition changing means in the form of a spring linkage coupling and magnetic latches for the fluid valve, the spring coupling being capable of joining the movement of the bellows linkage to the valve operating arm and of thereby transmitting the bellows movement to the valve through the spring and of thereby communicating tension to the spring which in turn communicates tension to the valve operating arm and alternately to one then the other of two magnetic latches attached to the valve and tending to hold the valve in one of the two valve conditions, the bellows linkage thereby being capable of significant movement in either direction prior to a communication of that movement to effect a valve condition change, a significant portion of said movement being utilized to provide adequate spring tension required to overcome the latching energy exerted by the magnetic latches.

6. An electric power generator as in claim 1 in which the fluid impeller of the temperature alternation means is in the form of a solar black box collector with its length disposed vertically to provide a heated vertical column of air within in the form of a convection column, said column of heated air being capable of rising within the collector by means of its heat and of exiting through a port at the top of the column thereby producing a draft at an inlet duct at its base which is capable of drawing air alternately from the heating means and then from the cooling means in order to heat and then to cool the temperature variable capacitors in serial fluid communication alternately with the convection column and the heating means and then with the convection column and the cooling means.

7. A generator as in claim 1 in which the fluid impeller of the temperature alternation means is in the form of a fan capable of being in alternate fluid flow communications first with valving and an air heating means and other valving and the temperature variable capacitors and then with valving and an air cooling means and other valving and the temperature variable capacitors, said fan being capable of moving alternate columns of air through those same elements periodically in fluid flow communication with each other in a cyclic manner thereby of moving one column through valving and the air heating means and other valving and the temperature variable capacitors and back to the fan again, and of moving another column through valving and the air cooling means and other valving and the temperature variable capacitors and back to the fan again and so on.

8. An electric power generator as in claim 1 in which the fluid heating means is a solar black box collector.

9. An electric power generator as in claim 1 in which the fluid cooling means is a heat exchanger located in a cool place such as in the earth.

10. A generator as in claim 1 in which the fluid cooling means is cooling provided by cool ambient air inducted through inlet ducts extending into surrounding ambient air.

11. An electric power generator as in claim 1 in which the valving of the temperature alternation means is in the form of bimetalic reed operated valves, having temperature sensitive bimetalic reeds and reed linkage capable of moving the valves by means of connections to the reeds, said reeds being capable of extensions and retractions under the influince of temperature alternations and of thereby alternating the valve conditions in correspondence with temperature alternations, one valve condition corresponding to a heated reed condition, the other corresponding to a cooled reed condition, with the valve condition in the heated reed position providing fluid flow between the capacitors and the fluid cooling means and with the valve condition in the cooled reed position providing fluid flow between the fluid heating means and the same temperature variable capacitors, and further as in claim 1 and having additionally an abrupt valve condition changing means in the form of cogs on the reed linkage and overcenter linkage arms with springs capable of interacting with the reed linkage to provide abrupt increments of motion for changing the valving condition at appropriate points in the extensions and retractions of the reed which points correspond to suitable changeover temperatures from heating to cooling and from cooling to heating of the capacitors, the cogs on the reed linkage being capable of moving with the reed linkage and of contacting the valves for condition changeover in the final increments of linkage travel in either direction of travel to produce a valve change only near the end of reed extensions and contractions, the overcenter linkage being capable of providing sudden acceleration to the reed linkage in either direction of travel to effect abrupt valve condition change for both changes of condition by means of the compression and sudden expansion of overcenter linkage springs attached to points above and below the reed linkage and held in tension against overcenter linkage arms fixed to the reed linkage in such a manner that a horizontal movement of the reed linkage beginning from either limit of reed linkage travel and moving toward the opposite limit of travel is capable of causing the overcenter arms first to compress the springs and then to allow the springs to expand and accelerate the reed linkage in its present direction.

* * * * *